(12) United States Patent
Melton et al.

(10) Patent No.: US 7,793,467 B1
(45) Date of Patent: Sep. 14, 2010

(54) PASSIVELY COOLED AND HEATED ELECTRICAL COMPONENTS AND POWER BUILDING

(76) Inventors: David S. Melton, 7301 Rosewood Ct. NW., Albuquerque, NM (US) 87120; Odes Armijo-Caster, 281 Valley High St. SW., Albuquerque, NM (US) 87105

( * ) Notice: Subject to any disclaimer, the term of this patent is extended or adjusted under 35 U.S.C. 154(b) by 391 days.

(21) Appl. No.: 10/769,949

(22) Filed: Feb. 2, 2004

Related U.S. Application Data

(60) Provisional application No. 60/444,127, filed on Jan. 31, 2003.

(51) Int. Cl.
E04H 1/00 (2006.01)

(52) U.S. Cl. ........................................ 52/79.1; 52/173.3

(58) Field of Classification Search ................ 52/79.1; 136/246, 291; 60/641.1, 641.8, 641.15
See application file for complete search history.

(56) References Cited

U.S. PATENT DOCUMENTS

| | | | |
|---|---|---|---|
| 1,951,360 A | 3/1934 | Holzwarth | |
| 2,364,144 A | 12/1944 | Hunsaker | 98/32 |
| 2,920,710 A | 1/1960 | Howard | 180/67 |
| 4,000,850 A | 1/1977 | Diggs | 237/1 |
| 4,147,157 A | 4/1979 | Zakhariya | 126/271 |
| 4,206,608 A | 6/1980 | Bell | 60/698 |
| 4,261,329 A | 4/1981 | Walsh et al. | 126/417 |
| 4,297,572 A | 10/1981 | Carlton | |
| 4,307,711 A | 12/1981 | Doundoulakis | |
| 4,359,951 A | 11/1982 | Dauvergne | |
| 4,371,135 A | 2/1983 | Keigler | |
| 4,373,308 A | 2/1983 | Whittaker | |
| 4,429,178 A | 1/1984 | Prideaux et al. | |
| 4,551,980 A * | 11/1985 | Bronicki | 60/698 |
| 4,553,037 A | 11/1985 | Veazey | |
| 4,569,331 A * | 2/1986 | Tani et al. | 126/585 |
| 4,628,692 A * | 12/1986 | Pierce | 60/641.8 |
| 4,913,985 A | 4/1990 | Baer | 429/50 |
| 4,982,569 A | 1/1991 | Bronicki | 60/698 |
| 4,995,377 A | 2/1991 | Eiden | |
| 5,143,556 A | 9/1992 | Matlin | |
| 5,212,916 A | 5/1993 | Dippel et al. | |
| 5,228,924 A | 7/1993 | Barker et al. | |
| 5,244,508 A | 9/1993 | Colozza | |
| 5,259,363 A | 11/1993 | Peacock et al. | 126/621 |
| 5,315,794 A * | 5/1994 | Pearson | 52/79.1 |

(Continued)

FOREIGN PATENT DOCUMENTS

JP   411069893 A   3/1999

(Continued)

OTHER PUBLICATIONS

"Solar Photovoltaic Flat Panel Applications Experiment. Draft Final Report, Sep. 30, 1978-Mar. 31, 1979", *Department of Energy Publication DOE/ET/23053-1* Mar. 1979.

*Primary Examiner*—Richard E Chilcot, Jr.
*Assistant Examiner*—Jessica Laux
(74) *Attorney, Agent, or Firm*—Deborah A. Peacock; Justin R. Jackson; Peacock Myers, P.C.

(57) ABSTRACT

A remote and portable, passively cooled and heated building that has a power system and telecommunications and other electrical equipment.

25 Claims, 9 Drawing Sheets

U.S. PATENT DOCUMENTS

| | | | |
|---|---|---|---|
| 5,452,710 A | 9/1995 | Palmer | 126/572 |
| 5,512,787 A | 4/1996 | Dederick | 290/4 |
| 5,730,117 A | 3/1998 | Berger | |
| 5,857,322 A * | 1/1999 | Cohn | 60/39.182 |
| D408,554 S | 4/1999 | Dinwoodie | |
| 5,969,501 A | 10/1999 | Glidden et al. | 320/101 |
| 5,986,203 A | 11/1999 | Hanoka et al. | |
| 6,016,634 A | 1/2000 | Sayer | |
| 6,058,930 A | 5/2000 | Shingleton | |
| 6,101,750 A | 8/2000 | Blesener et al. | 40/448 |
| 6,201,181 B1 | 3/2001 | Azzam et al. | |
| 6,357,512 B1 * | 3/2002 | Baer et al. | 165/48.2 |
| 6,372,978 B1 | 4/2002 | Cifaldi | |
| 6,396,239 B1 | 5/2002 | Benn et al. | |
| 6,551,017 B1 | 4/2003 | Strassman | |
| 6,552,257 B1 | 4/2003 | Hart et al. | |
| 6,559,371 B2 | 5/2003 | Shingleton et al. | |
| 6,559,552 B1 | 5/2003 | Ha | |
| 6,563,040 B2 | 5/2003 | Hayden et al. | |
| 6,606,823 B1 | 8/2003 | McDonough et al. | |
| 6,672,018 B2 | 1/2004 | Shingleton | |
| 6,930,237 B2 | 8/2005 | Mattiuzzo | |
| 7,190,531 B2 | 3/2007 | Dyson et al. | |
| 7,252,083 B2 | 8/2007 | Hayden | |
| 7,285,719 B2 | 10/2007 | Conger | |
| 7,469,541 B1 | 12/2008 | Melton | |
| 7,472,739 B2 | 1/2009 | Heidenreich | |
| 7,531,741 B1 | 5/2009 | Melton | |
| 2002/0153178 A1 | 10/2002 | Limonius | |
| 2003/0009954 A1 | 1/2003 | Bradley | |
| 2003/0054329 A1 | 3/2003 | Springett | |
| 2003/0105556 A1 | 6/2003 | Enis et al. | 700/286 |
| 2004/0139689 A1 | 7/2004 | Sinha et al. | |
| 2005/0055891 A1 | 3/2005 | Kuebler | |
| 2005/0109384 A1 | 5/2005 | Shingleton et al. | |
| 2005/0150175 A1 | 7/2005 | Guigan | |
| 2007/0158975 A1 | 7/2007 | Atchison et al. | |
| 2008/0216418 A1 | 9/2008 | Durham | |
| 2009/0050194 A1 | 2/2009 | Noble et al. | |

FOREIGN PATENT DOCUMENTS

| | | |
|---|---|---|
| JP | 2000116007 A | 4/2000 |
| JP | 2002194912 | 7/2002 |

* cited by examiner

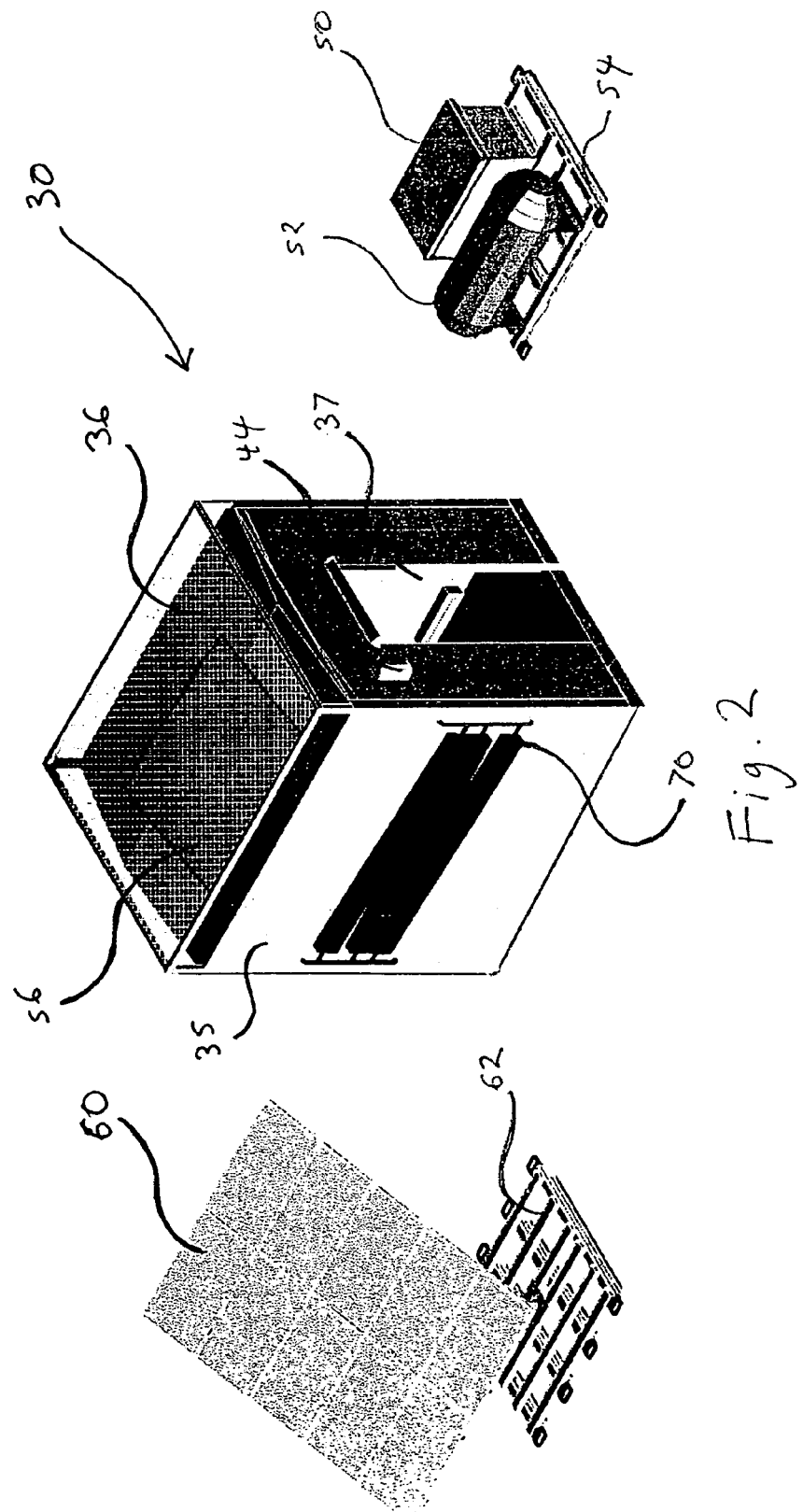

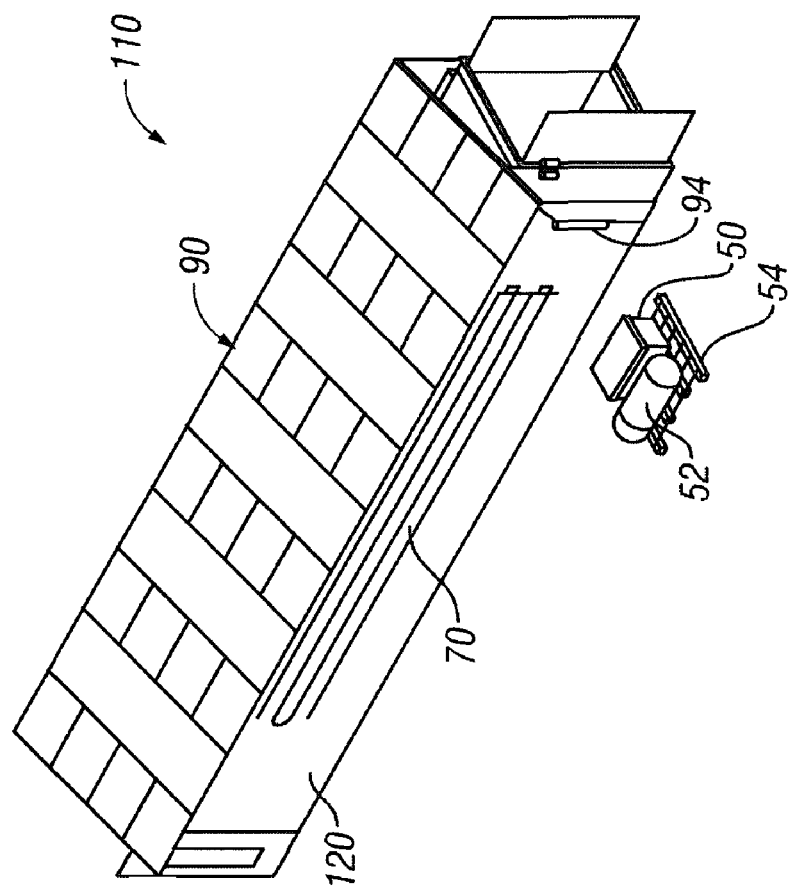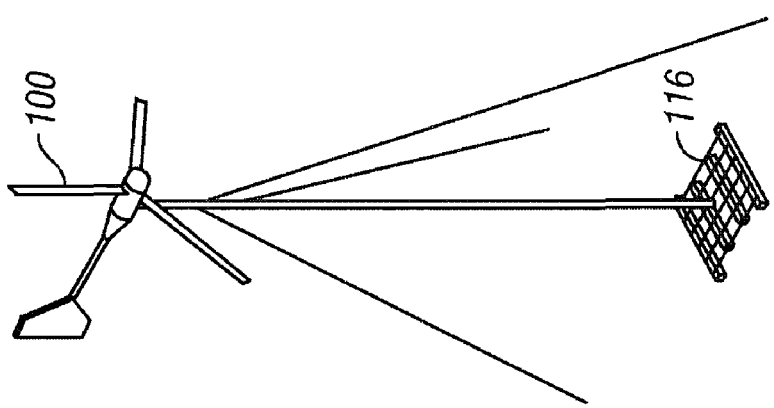
FIG. 8

US 7,793,467 B1

PASSIVELY COOLED AND HEATED ELECTRICAL COMPONENTS AND POWER BUILDING

CROSS-REFERENCE TO RELATED APPLICATIONS

This application claims the benefit of the filing of U.S. Provisional Patent Application Ser. No. 60/444/127, entitled "Cooled and Heated Structure", filed on Jan. 31, 2003, and the specification thereof is incorporated herein by reference.

This application also claims priority to a related application entitled "Portable Power System", U.S. patent application Ser. No. 10/725,671, filed on Dec. 2, 2003; and U.S. Provisional Patent Application Ser. No. 60/430,215, entitled "Remote Power System", filed on Dec. 2, 2002, and the specification and claims thereof are incorporated herein by reference.

BACKGROUND OF THE INVENTION

1. Field of the Invention (Technical Field)

The present invention relates to a portable, passively cooled and heated building that has a power system and telecommunications and other electrical equipment. The building comprises solar electric and solar thermal components to cool and heat the interior of the building. The building comprises a power structure comprising one or more of the following components: a solar energy power system, batteries, a back-up generator, and a wind energy system. The building and components are constructed on a platform that is transportable to a location, including remote locations.

2. Description of Related Art

Note that the following discussion refers to a number of publications by author(s) and year of publication, and that due to recent publication dates certain publications are not to be considered as prior art vis-a-vis the present invention. Discussion of such publications herein is given for more complete background and is not to be construed as an admission that such publications are prior art for patentability determination purposes.

There is a need in the telecommunications industry and other industries that utilize electrical equipment to economically power, heat, and cool equipment enclosures or shelters that are located in remote areas or otherwise have limited access to utilities. Entities engaged in humanitarian relief endeavors are but one example of those having a need for such buildings. Remote villages and other settlements are other examples.

Methods and devices for providing passive cooling or heating to structures, for providing remote power, or for using hybrid, renewable energy sources are known. For example, U.S. Pat. No. 6,357,512 discloses a passive heating and cooling system for shelters. The system comprises warm and cold water conduits that circulate water between a radiator/absorber and a water container. Cold water circulates via a thermal siphon to dissipate heat at night into the atmosphere. When heating is desired, a pump is used to circulate water. The invention does not provide for portability nor does it provide for the delivery of energy power or telecommunications.

U.S. Pat. No. 5,259,363 discloses a solar roofing system to collect heat from the air and to generate electricity. It relies on air to air, or air to liquid, transfer of heat. It is neither a portable nor hybrid system.

U.S. Pat. No. 4,000,850 discloses a building that is solar heated and cooled. It is insulated and uses solar panels to heat fluid that flows through conduits. Pumps are used to aid in the circulation. The building is modular to allow for assembly and dis-assembly, but is not truly portable. It is designed to help lower energy costs, but it does not deliver energy power or telecommunications.

U.S. Pat. No. 2,364,144 discloses a thermally regulated enclosure for electrical equipment using ventilation as a means for cooling the structure. It is not portable nor does it deliver energy power.

U.S. Pat. No. 4,147,157 discloses a self-supporting active solar energy system using solar collectors to heat fluid that is stored in tanks until needed. It uses an electric motor pump to circulate the liquid. The invention does not disclose portability or the provision of energy power or telecommunications.

U.S. Patent Application Publication 2003/0105556 discloses a method and device for using wind to supply uninterrupted power to locations not served by a power grid. However, the invention does not provide for portability and uses only wind energy that may be stored as compressed air.

U.S. Pat. No. 6,559,552 discloses an electric generating installation using rain, wind, wave, and solar energy. The invention relies on at least one of the sources being active to provide for continuous energy generation. This patent does not describe portability or a building structure that is passively cooled and heated.

U.S. Pat. No. 6,101,750 discloses a "portable message sign". The sign is portable, but harnesses only solar energy for powering only a sign. A building structure with passive cooling and heating is not disclosed.

U.S. Pat. No. 4,261,329 discloses a portable housing module that contains a "solar energy system", but the system is not passively cooled and heated nor does it provide other types or energy power or telecommunications.

U.S. Pat. Nos. 4,982,569 and 4,551,980 disclose hybrid systems for generating power. Portability is not disclosed, and only photovoltaic and wind energy are harnessed to charge a battery and to supply current to an electrical load. Neither portability nor a building structure with passive cooling and heating is disclosed.

U.S. Pat. No. 4,206,608 discloses a system for the storage and generation of electricity using solar, wind, and wave energy. Neither portability nor a building structure with passive cooling and heating is disclosed.

Japanese Patent JP411069893A discloses a power generation system using wind energy, solar energy, and an engine. Japanese Patent JP02000116007A discloses a power generation system using wind power and a solar battery. Neither patent discloses portability, a building structure, or passive heating and cooling for the structure.

U.S. Pat. No. 5,969,501 discloses a portable solar power system. Portability is an objective of the invention, but only solar energy is harnessed. Neither a building structure nor passive cooling and heating are disclosed. The solar power system is not severable from the disclosed trailer.

The prior art does not address the need to provide portable, continuous, reliable, and renewable energy power and telecommunications—particularly to remote sites.

BRIEF SUMMARY OF THE INVENTION

The present invention comprises a portable electrical components building. The building comprises at least one wall and roof forming an enclosure, passive heating and cooling components, a power system, batteries, and a transportable platform as a base. The passive heating and cooling components comprise cooling tanks filled with water. The cooling tanks are disposed under the building's roof. The passive heating and cooling components also comprise thermal exchangers.

The building may further comprise a communications system and may further comprise an electric output connector that connects the batteries to an electrical demand source to supply electric energy to the source of electrical demand. The building comprises an inverter to convert energy from direct current to alternating current.

The building is transportable to remote locations via a transporting vehicle.

The building's power system may comprise a solar energy power system that comprises at least one solar panel and optionally a solar panel array comprising photovoltaic cells. The solar panel array produces greater than 640 watts. The solar energy power system tracks and moves in the direction of the sun to maximize power.

The building's power system may also comprise a wind energy system or a generator with optional fuel storage container. The building's power system may comprise any combination of the solar energy power system, wind energy system, and generator with optional fuel storage container. The building's power system is optionally disposed within the building.

The building may comprise at least one pump to circulate a fluid.

A primary object of the present invention is to provide a portable, reliably and passively cooled and heated structure to deliver power and telecommunications or other electrical equipment and service.

A primary advantage of the present invention is that it makes use of renewable energy to maintain and deliver power, telecommunications service, and other electrical equipment to remote sites immediately upon delivery.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into, and form a part of, the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIG. 2 shows a side perspective view of the building of an embodiment of the present invention with a separate solar energy system;

FIG. 8 shows an embodiment of the present invention showing an ISO container and deployed wind and generator systems.

DETAILED DESCRIPTION OF THE INVENTION

Figure 1:
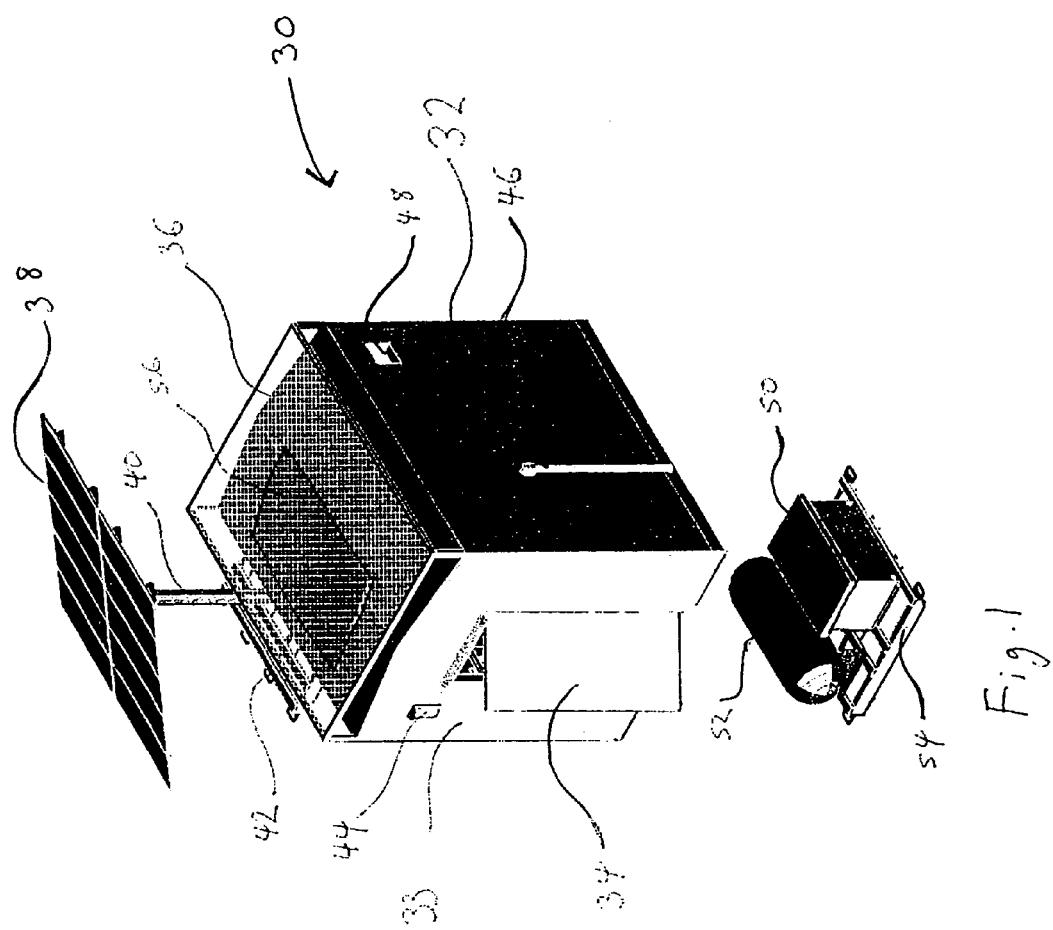
FIG. 1 shows a side perspective view of the building an embodiment of the present invention with optional energy components.

The present invention comprises a ready-built, or kit, portable building that provides energy power and houses telecommunications and other electrical equipment. The building comprises solar electric and solar thermal components to passively heat and cool the building. The building further comprises interior options for the placement of equipment and may comprise power generating or harnessing components that optionally include a solar energy power system, batteries, a power generator with optional fuel tank, and a wind energy system. The building and power components are disposed on one or more platforms that are transportable to any location, including remote locations by any type of transportation vehicle. In the preferred embodiment, the transportable platform is a skid plate. The building may comprise tilt-up tubular towers.

The preferred embodiment of the invention comprises steel or other similar structural building material. Preferably, industrial grade paint or enamel is used as a finish. The building is preferably built in a controlled environment and transported to a remote site. In one embodiment, the building is of compact size and is mounted on a transportable platform. In the preferred embodiment, the transportable platform is a skid plate. In another embodiment, the building comprises a larger enclosure, such as an ISO container. In either embodiment, the building is of sufficient weight to provide stability to the building when it is disposed on a chosen site. The building is virtually maintenance free and fully automated.

Because the building is built in a controlled environment, the erection and connection of optional components such as a solar array, wind tower, and generator equipment is required, but no other off-site construction is required. Such components can attach to the building's steel frame and connect directly to the power conditioning equipment located inside the building. In the larger, ISO container-type embodiment, external buildings are assembled upon delivery of the building, but the container provides the benefit of acting as the transportation container for all related components.

The energy power systems provide power to equipment associated with the building such as, for example, telecommunications equipment and other equipment housed within the building. The energy power systems optionally power other, separate electrical demand sources such as separate structures, buildings, and equipment to which the building and power systems are brought to provide energy service. The provision of energy power to such electrical demand sources is particularly useful to remote locations in need of such power but having no other access to such power. For example, the present invention can deliver power to remote villages. The embodiment that comprises the larger, ISO-type container is particularly useful in this regard as it and the associated power systems may be delivered in an efficient self-contained manner and is large enough to provide more powerful configurations.

In an alternative embodiment, the building incorporates Cool Cell™ passive cooling technology that comprises cooling tanks located under the shelter's roof. The tanks are filled with water that absorbs the heat generated by the equipment and solar energy during the day and releases the heat at night via a radiator mounted on the building. The water then absorbs the cooling effects of the night air to provide chilled fluid that cools the inside of the shelter the following day.

In all embodiments, thermal exchangers are disposed on the outside of the south wall and a thermal storage tank is located on the inside under the roof next to the south wall. The tanks are filled with a glycol/water solution. Heat is transferred from the thermal exchanger to the thermal storage tank to heat the building. If cooling is desired, the thermal exchangers are shaded from solar heat and are exposed to cool air so that the liquid is cooled and cools the interior of the building.

The building comprises an alternating current ("AC") service entrance panel with breakers, an electric baseboard heater, and outside and inside lights. The building may comprise a direct current/alternating current power conversion system with a sine-wave invertor, a trace control panel with a meter, a charge collector, a direct current ("DC") disconnect breaker box, a battery temperature sensor, and a generator start module.

The batteries of the building comprise a battery bank of preferably eight 225 Amp-hr, industrial grade, deep-cycle, maintenance-free, gel-cell batteries, although the batteries may vary from 15 to 25 kWh. The energy produced by the solar system, wind energy system, and/or generator is stored in the batteries.

The solar hybrid power system comprises true sine-wave power conditioning units. The solar energy power system preferably comprises at least one solar panel and most preferably a solar panel array comprising photovoltaic cells. The solar array is preferably greater than 640 watts. The solar system preferably tracks the sun and thereby moves in the direction of the sun so that the maximum energy is produced. The tracking system preferably comprises a dual-axis tracker that provides more power in comparison to a fixed mounted or seasonally adjusted type photovoltaic module racking.

The generator may be of any energy type such as propane, fuel cell, etc. A preferably 120 to 500-gallon storage tank compliments the generator if it uses a fuel that can be stored in the storage tank. The generator is preferably skid mounted and is preferably of between 7 kW and 15 kW. In an embodiment using a propane generator combined with a dedicated large propane tank, the generator is not overstressed and is operated at its peak for shorter periods of time maximizing its efficiency, thereby extending its service life.

The wind energy system comprises conventional wind energy machines, known in the art, such as a propeller windmill, "eggbeater" style windmill, wind turbine and the like. The wind energy system is preferably mounted on a tower of, for example, 20-40 feet, preferably 30 feet that is located on the steel frame or platform for providing energy. Wind energy is particularly useful to provide supplemental power at night or on windy days. The wind turbine is preferably a 300 to 3,000 Watt, preferably 1,000 Watt, wind turbine. Larger and more powerful turbines are optional.

The output voltage of the embodiment comprising the smaller building is preferably 120 Vac, 60 Hz, single phase. The load capacity is may range from 15 to 50 Amps, preferably 15 Amps (3 outlets). The power sources for optional components power sources include an invertor output power of 2.5 kW to 10 kW. Battery capacity may vary widely as a matter of preference such as, or example, 900 Amp-hr at 24 Vdc. The building may comprise a 120 or 240 Vac step-up transformer (60 Hz).

The electrical systems are pre-installed and pre-wired except for the electrical work required to route and wire the grounding conductors and to route and wire the AC power inputs and wiring related to the optional power sources. For AC input, outside conduit and wall penetration is provided on the north side of the building. Ground wires exit at floor exits and connect to the ground grid and a driven ground rod. Telecommunications equipment connect into AC outlets.

For the photovoltaic source, a DC to AC power conversion system and batteries are provided and preferably mounted on the inside of the wall facing south. The batteries are preferably installed on a dual-level battery rack and wired for 24 V operation. The batteries are preferably secured with a cable harness.

The photovoltaic array conduit and wiring attach to a disconnect box. Generator conduit and wiring attach to the AC conduit entrance on the north side of the building. If utility power is available and used, the wiring and conduit of the utility power attach to the AC conduit entrance preferably located on the north side of the building.

Turning now to the figures, which illustrate the preferred embodiment of the invention, FIG. 1 shows building 30 of the present invention with north side wall 32 containing AC input 46 and optional opening 48, and east wall 33 with door 34 and outside light 44. Ice shield 36 prevents ice from forming on top of building 30. Visible is radiator 56 to which water flows for dissipation of heat and cooling. In this embodiment, three solar components 38, 40, 42 are disposed close to, and are partially supported by building 30. These solar components include solar system panels 38 which are disposed on solar support column 40 which is attached to skid plate 42. Also shown is generator 50 with optional storage tank 52 and generator skid plate 54. Optionally, an embodiment of the present invention can comprise a wind turbine with wind tower and satellite communications system. In an alternative embodiment, the present invention can include an insulated door, an ice shield, and a radiator.

FIG. 2 depicts an embodiment wherein solar system photovoltaic array 60 and solar system skid plate 62 are disposed at some distance from building 30. Thermal exchangers 70 are disposed on south wall 35 to absorb thermal heat when required. Doorway 37 is visible.

Figure 3B:
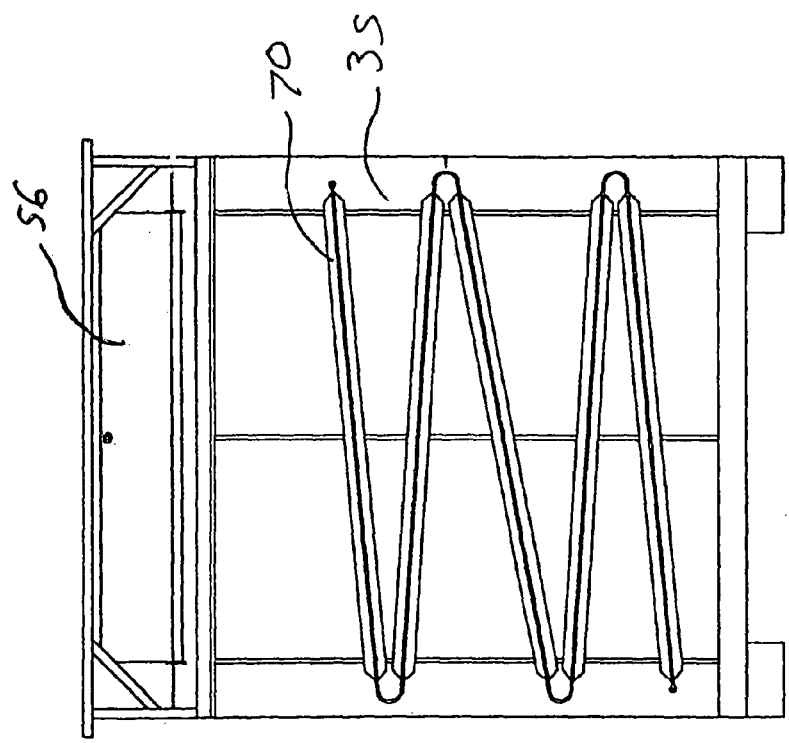
FIG. 3b shows a side view of the building of an embodiment of the present invention facing a south wall and showing thermal exchangers.
Figure 3A:
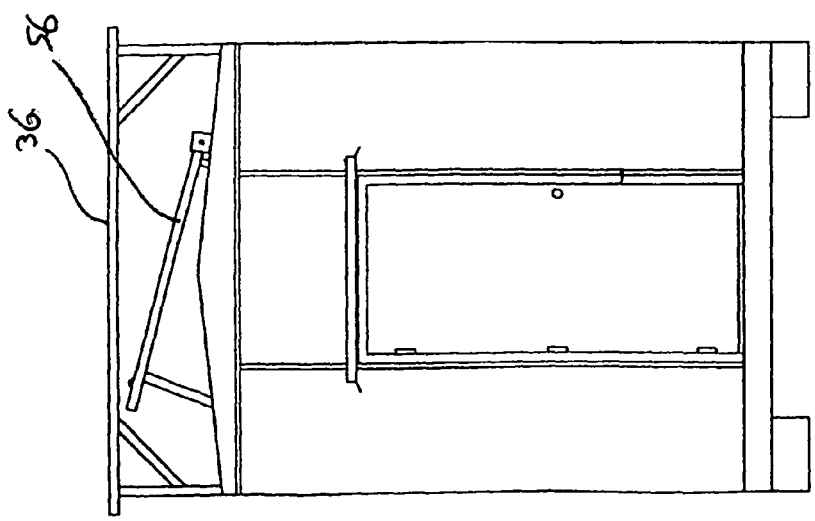
FIG. 3a shows a side view of the building of an embodiment of the present invention facing a west wall.
Figure 4:
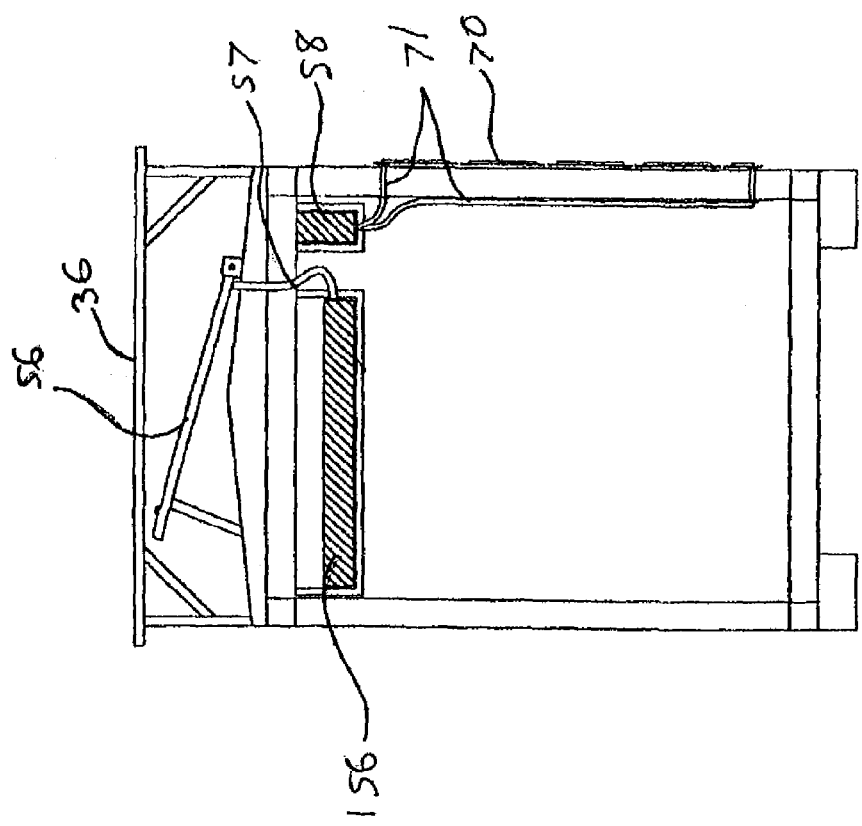
FIG. 4 shows a side view of the building of an embodiment of the present invention showing the inside through the west wall so that the cooling tanks and thermal storage tank are visible.

FIGS. 3a and 3b show ice shield 36 above radiator 56. FIG. 3b also shows thermal exchanger 70 on south wall 35. FIG. 4 shows thermal exchanger 70 connected to thermal storage tank 58 via conduit 71 and cooling tank 156 connected to radiator 56 via conduit 57.

Figure 5:
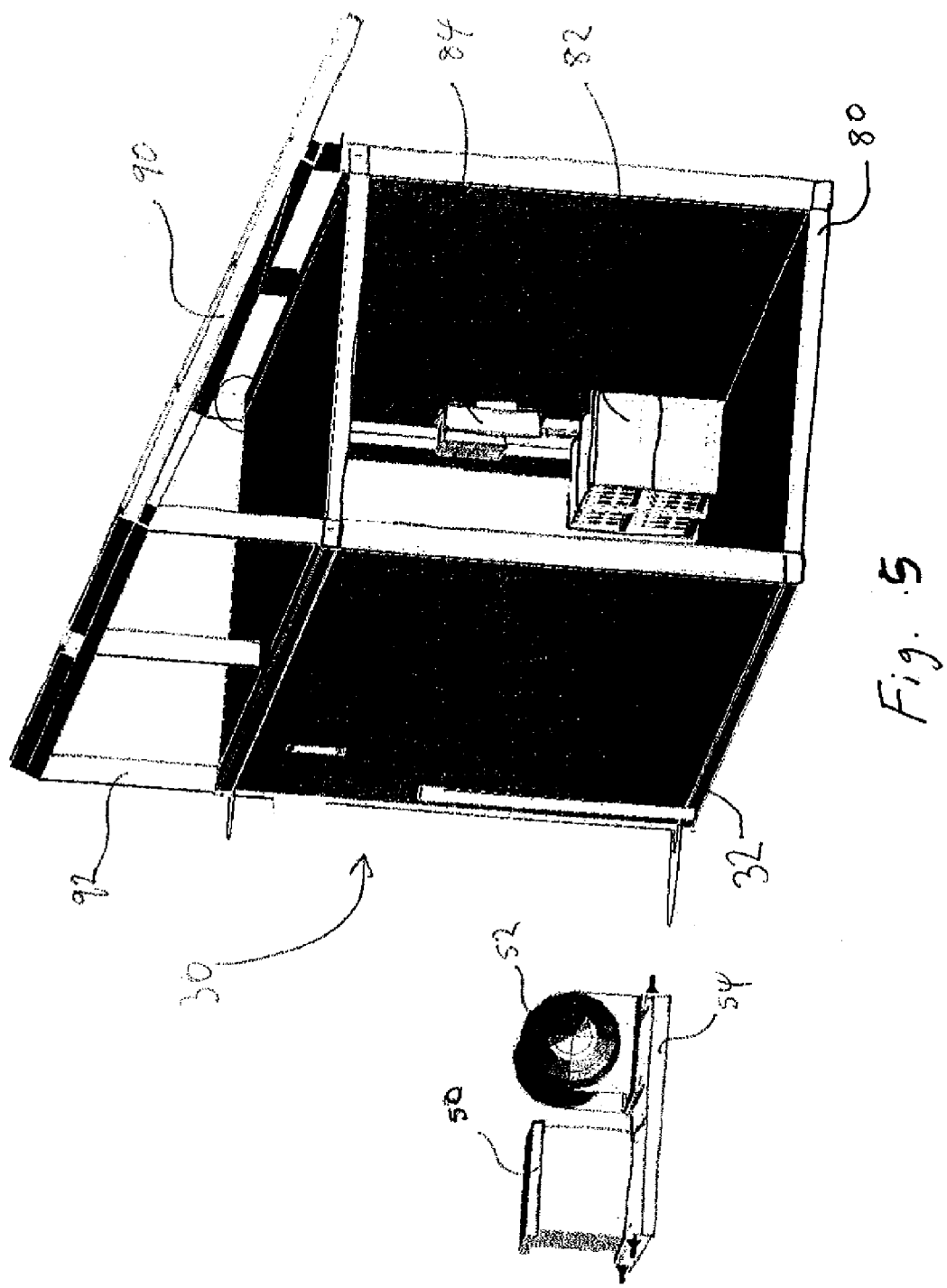
FIG. 5 shows a side perspective view of the outside of the building of an embodiment of the present invention with roof-mounted solar panels and with a side wall removed and showing batteries.
Figure 6:
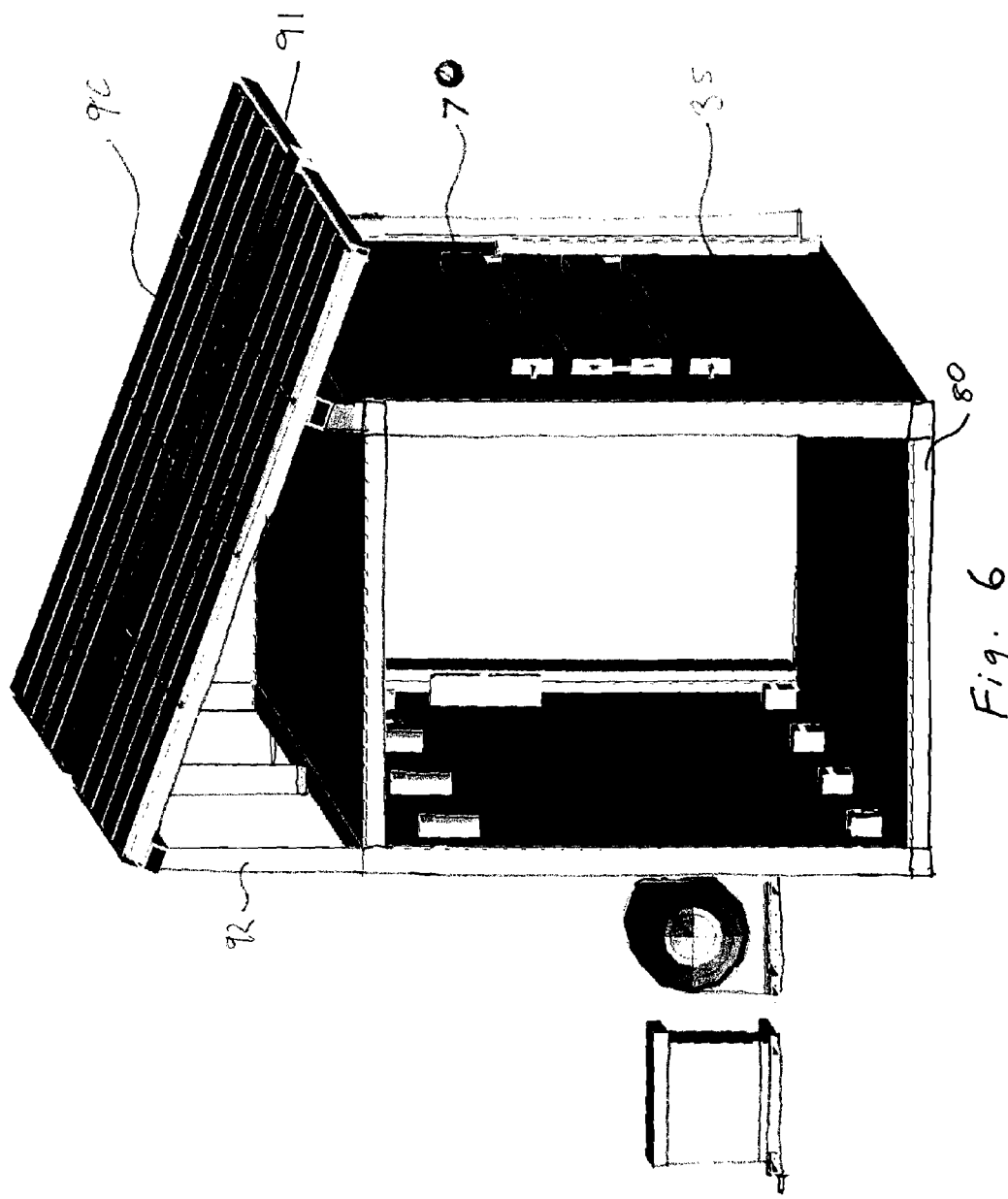
FIG. 6 shows a side perspective view of the building of an embodiment of the present invention with a side wall removed and showing thermal exchangers on the south wall.

The embodiment, with a wall removed to show the inside of building 30, depicted in FIG. 5 shows solar system photovoltaic array 90 disposed on top of building 30 and supported by columns 92. Visible are batteries 82 and AC service entrance panel 84. Support plate 80 provides for lifting and transportation of building 30. FIG. 6 shows a view of the south-side of the building of the preferred embodiment. Solar system photovoltaic array 90 collects heat and transfers the heat to the inside of building 30. In FIG. 6, thermal exchangers 70 are shown on south wall 35 shaded by shade 91.

Figure 7:
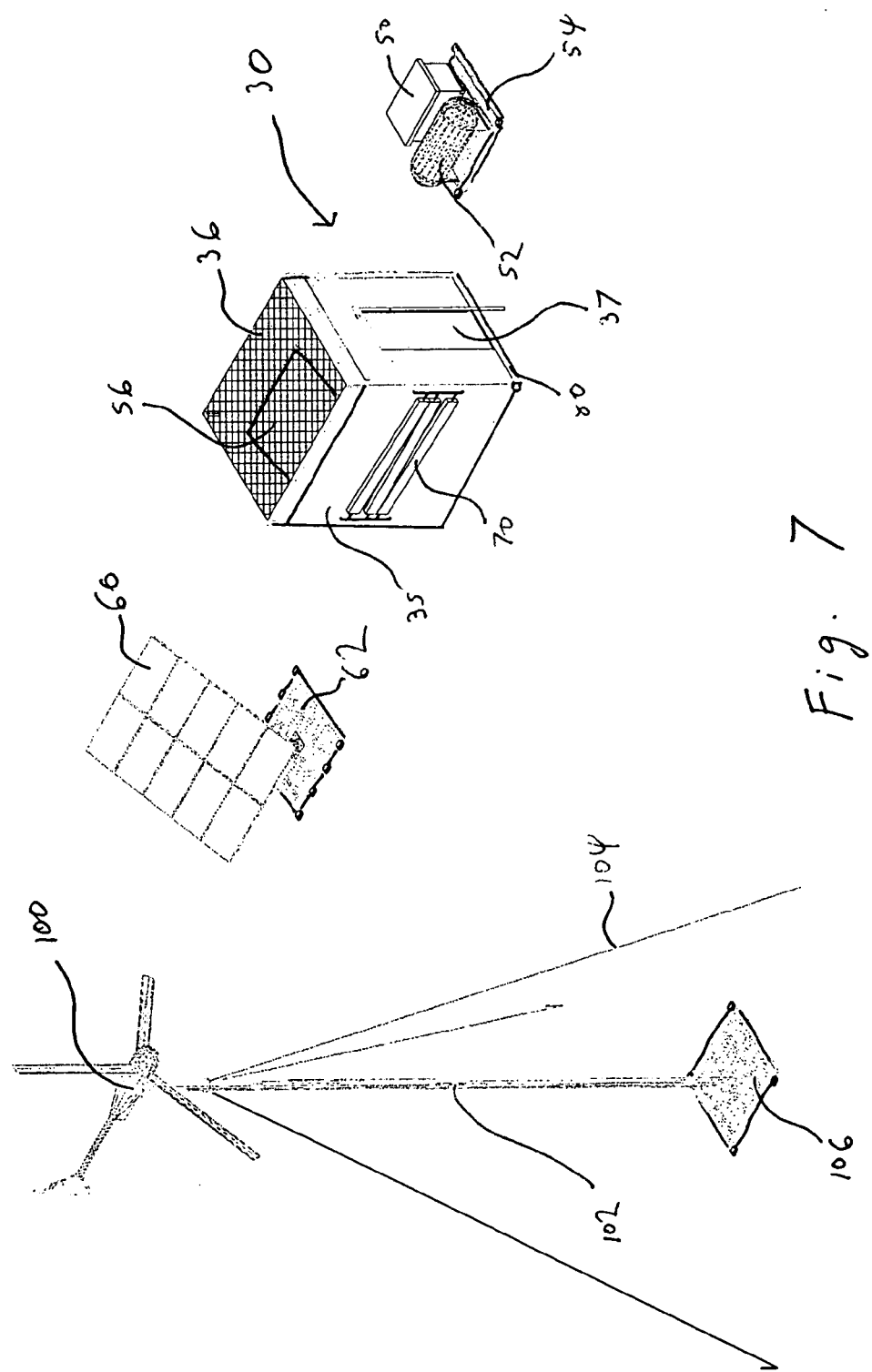
FIG. 7 shows a top perspective view of an embodiment of the present invention and showing all optional power system systems.

In FIG. 7, all the power system options are visible. Wind turbine 100 is disposed on column 102, held stable by cables 104, mounted on skid plate 106, and, in this embodiment, disposed some distance from building 30.

Figure 9:
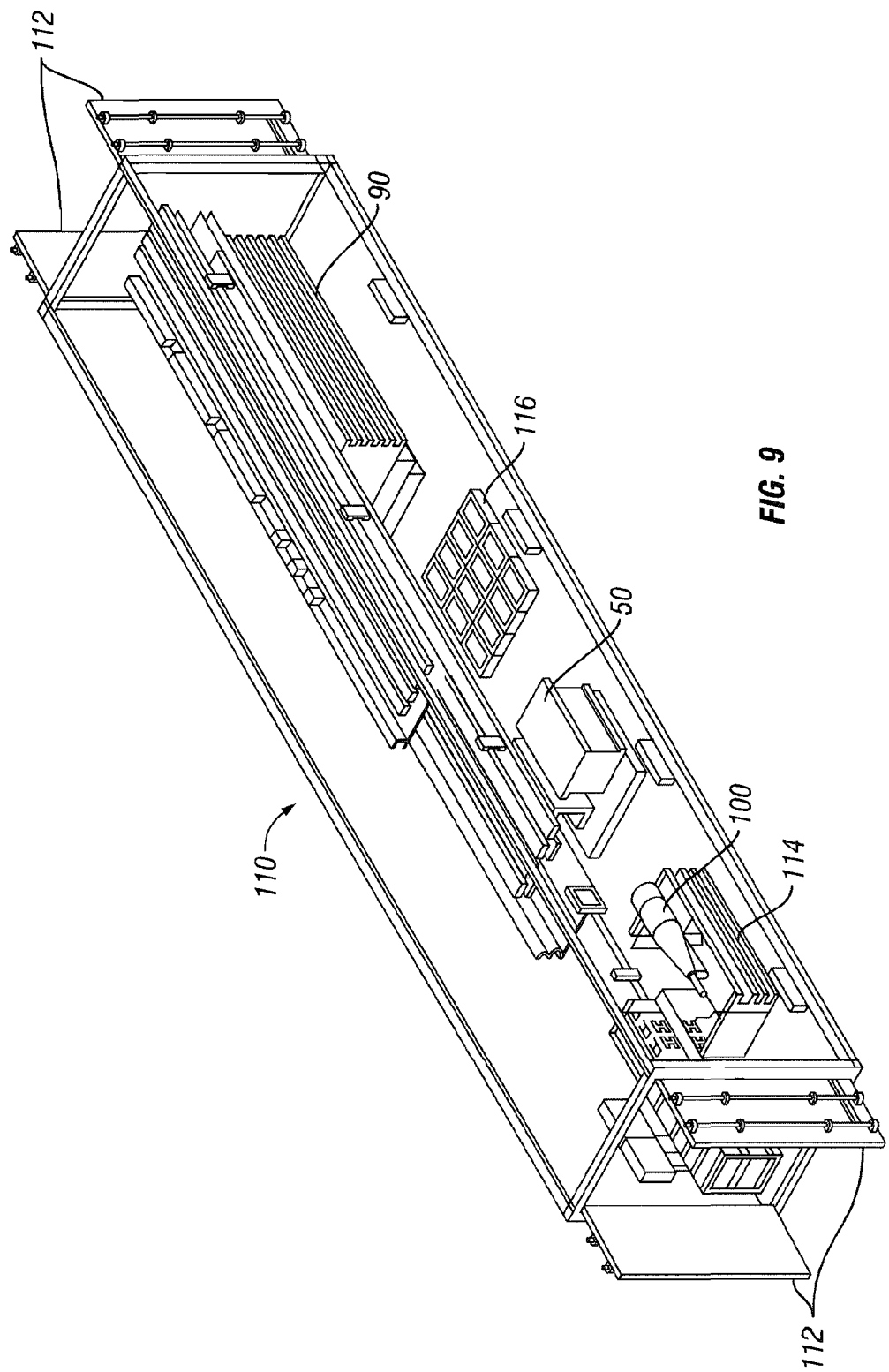
FIG. 9 shows a side perspective view of an embodiment of the present invention showing an ISO container with side walls removed to show power components in a transportable orientation.

FIGS. 8 and 9 depict an embodiment of the present invention wherein building 110 comprises a larger, ISO-type container. FIG. 8 shows south wall 120 with thermal exchangers 70 and DC input 94. Solar system photovoltaic array 90 is disposed on top of building 110. Wind turbine 100 with skid plate 116 are disposed some distance from building 110. FIG. 9 depicts building 110 without walls to show the orientation of optional power systems in their stored, transportable configuration. Doors 112 and 112' open on two ends of building 110 for access to the interior of building 110. Solar system photovoltaic array 90 is stacked and stored for safe transport. Wind turbine 100 is disposed on transportation skid plate 114 during transport, but is later erected on skid plate 116. Generator 50 is transportable on its skid plate.

EXAMPLE

A building was constructed in accordance with the present invention which included the following:
  Cool Cell Technology (manufactured by Zomeworks of Albuquerque, N. Mex.)
  8'×10'×9.5' enclosure with repeater racks and electrical equipment
  All steel construction with an industrial grade enamel finish
  R-30 insulation in the walls, floor and ceiling
  Non-conductive vinyl flooring and Panolam inner walls and ceiling
  Skid mounted on 4" I-Beams including forklift ports and varmint shield
  Heavy duty 3"×7" entry
  Interior and exterior energy efficient lighting
  20A 120 VAC interior receptacles
  Interior halo grounding
  Solar Power system with gel cell batteries, 2400 watts of continuous true sine-wave ac power, and one large 800 watt PV array
  Compact size for transportability, but heavy weight for stability.

In the example, test results show that the average daily winter shelter temperature will be 38° F. when the outside ambient temperature is 20° F. The passive heating technology raises the temperature inside the building by 18° F. On sunny winter days, the solar heating system adds an additional 6,000 Btu/day to raise the 38° F. base temperature by another 16° F. for a total average shelter temperature of 54° F. When temperatures are colder, building temperatures will also be lower. If more heat is required, the solar heating system can be easily increased in size and power to meet the demand.

During extremely cold, cloudy weather, the thermal mass of the water within the shelter provides 184,320 Btu's of heat as it freezes. This heat is enough to guard the shelter from subfreezing temperatures for a period of 10 days at −17° F. 372.4 Btu/° F./day. Daily internal heat dissipation is preferably 6,826 Btu/day. The daily internal temperature rise caused by the heat dissipation of equipment is 18° F.

Internal heat dissipation was shown to be 83 watts, and the shelter envelope load was 372.4 Btu/° F. per day. Internal heat dissipation was 6,826 Btu/day. The daily internal temperature rise due to heat dissipation of equipment was 18° F.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A portable electrical components building comprising:
  a portable building structure comprising at least one wall and roof;
  passive cooling components comprising a radiator disposed at a top of said portable building structure connected to a cooling tank;
  passive heating components comprising a thermal exchanger disposed outside of an exterior wall of said portable building structure and connected to a thermal storage tank;
  a shade disposed on said roof and extending beyond said exterior wall for shading said thermal exchanger, said thermal exchanger exposed to cooler air under said shade for cooling said building;
  a power system comprising a solar energy power system disposed above said portable building structure;
  an electric output connector;
  at least one battery; and
  a portable platform comprising skids as a base.

2. The building of claim 1 wherein said cooling tank is filled with water.

3. The building of claim 2 wherein said cooling tank is disposed under said roof.

4. The building of claim 1 further comprising a communications system.

5. The building of claim 1 wherein said electric output connector connects said at least one battery to an electrical demand source to supply electric energy to said source of electrical demand.

6. The building of claim 1 further comprising an inverter to convert energy from direct current to alternating current.

7. The building of claim 1 wherein said building is transportable to remote locations via a transporting vehicle.

8. The building of claim 1 wherein said solar energy power system produces greater than 640 watts.

9. The building of claim 1 wherein said solar energy power system tracks and moves in the direction of the sun to maximize power.

10. The building of claim 1 wherein said power system comprises a wind energy system.

11. The building of claim 1 wherein said power system comprises a generator.

12. The building of claim 1 further comprising a fuel storage container.

13. The building of claim 1 wherein said power system comprises a wind energy system and a generator.

14. The building of claim 1 further comprising at least one pump to circulate a fluid.

15. The building of claim 1 further comprising an ice shield.

16. The building of claim 1 wherein said shade comprises a solar panel of said solar energy power system.

17. A method for providing a portable building comprising:
  providing at least one wall and roof forming a portable building structure;
  providing passive cooling components comprising a radiator disposed at a top of the portable building structure connected to a cooling tank;

providing passive heating components comprising a thermal exchanger disposed outside of an exterior wall of the portable building structure connected to a thermal storage tank;

disposing a shade on the roof and extending the shade beyond the exterior wall for shading the thermal exchanger;

exposing the thermal exchanger under the shade to cooler air and cooling the interior of the building;

powering components in the portable building structure with a solar power system disposed above the portable building structure and batteries; and transporting the portable building structure via a portable platform comprising skids.

18. The method of claim 17 further comprising filling the cooling tank with water and disposing the cooling tank under the building's roof.

19. The method of claim 17 wherein the radiator and thermal exchanger passively heat and/or cool the portable building.

20. The method of claim 17 further comprising providing a communications system to the building.

21. The method of claim 17 further comprising transporting the building and the transportable platform to a location where power and electrical equipment are required.

22. The method of claim 21 further comprising transporting the building and transportable platform to a remote location.

23. The method of claim 17 further comprising connecting a power system to a source of electrical demand.

24. The method of claim 17 further comprising providing a fuel storage container.

25. The method of claim 17 further comprising powering components in the portable building structure with a wind energy system.

* * * * *